US012593477B2

(12) United States Patent
Okada et al.

(10) Patent No.: US 12,593,477 B2
(45) Date of Patent: Mar. 31, 2026

(54) SEMICONDUCTOR DEVICE WITH ANODE TRENCH

(71) Applicant: WILL SEMICONDUCTOR (SHANGHAI) CO. LTD., Shanghai (CN)

(72) Inventors: Tetsuya Okada, Saitama (JP); Kikuo Okada, Saitama (JP); Hiroki Arai, Saitama (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 370 days.

(21) Appl. No.: 18/340,485

(22) Filed: Jun. 23, 2023

(65) Prior Publication Data

US 2024/0347584 A1 Oct. 17, 2024

(30) Foreign Application Priority Data

Apr. 17, 2023 (JP) ................................. 2023-066921

(51) Int. Cl.
*H10D 62/10* (2025.01)
*H10D 8/00* (2025.01)
*H10D 62/17* (2025.01)

(52) U.S. Cl.
CPC ............... *H10D 62/10* (2025.01); *H10D 8/00* (2025.01); *H10D 62/393* (2025.01)

(58) Field of Classification Search
CPC .... H10D 62/10; H10D 62/393; H10D 62/128; H10D 62/129
See application file for complete search history.

(56) References Cited

U.S. PATENT DOCUMENTS

2016/0181391 A1* 6/2016 Bobde .................... H10D 8/045
438/270
2023/0036039 A1* 2/2023 Matsui ................. H10D 84/811

* cited by examiner

*Primary Examiner* — Wasiul Haider
(74) *Attorney, Agent, or Firm* — MUNCY, GEISSLER, OLDS & LOWE, P.C.

(57) ABSTRACT

A semiconductor device includes: an anode electrode, formed on a front surface of a semiconductor substrate; a cathode electrode, formed on a back surface; a P layer, formed on the anode electrode side; an N layer, formed on the cathode electrode side; an N+ layer, arranged between the P layer and the N layer and having a higher carrier concentration than the N layer; and an anode trench, which extends from the front surface of the semiconductor substrate toward the back surface side thereof and extends to the N+ layer through the P layer, and in which an insulating film is formed between the peripheral N+ layer, and a conductive material arranged inside is connected to the anode electrode.

3 Claims, 5 Drawing Sheets

Recovery waveform

SEMICONDUCTOR DEVICE WITH ANODE TRENCH

BACKGROUND OF THE INVENTION

1. Field of the Invention

The disclosure relates to a semiconductor device, and particularly, to reduction of recovery loss.

2. Description of the Related Art

Current control using a PN junction has recently been used in a semiconductor device. A diode has a PN junction, allows a current flowing from an anode on a P side to a cathode on an N side, and blocks a current flowing in an opposite direction. And, during conduction, a large quantity of carriers, that is, holes from the anode and electrons from the cathode, are injected, and a forward voltage drop VF during conduction is lowered.

On the other hand, during recovery, the injected holes and electrons (carriers) are respectively discharged into the anode and the cathode, so that a recovery loss Err is increased if a large quantity of carriers exist.

In Patent document 1, it is disclosed that a lifetime killer is set up to eliminate internal carriers, thereby speeding up the discharge of the carriers.

PRIOR ART DOCUMENTS

Patent Documents

[Patent document 1] International Publication No. WO2017/146148

SUMMARY OF THE INVENTION

Problems to Be Solved

Here, a lifetime killer is set up by forming a semiconductor crystal defect, and large-scale apparatuses and work processes are required for this processing. Furthermore, the set-up of the lifetime killer also causes problems such as deterioration of temperature characteristics and increase of leakage currents.

Means to Solve Problems

A semiconductor device related to the disclosure includes:
a semiconductor substrate;
an anode electrode, formed on a surface of the semiconductor substrate on one side;
a cathode electrode, formed on a surface of the semiconductor substrate on the other side;
a P layer, formed on the anode electrode side in the semiconductor substrate;
an N layer, formed on the cathode electrode side of the P layer in the semiconductor substrate;
an N+ layer, arranged between the P layer and the N layer and having a higher carrier concentration than the N layer; and
an anode trench, which extends from the surface of the semiconductor substrate on one side toward the surface on the other side and extends to the N+ layer through the P layer, and in which an insulating film is formed between the peripheral N+ layer, and a conductive material arranged inside is connected to the anode electrode.

Effects

According to the semiconductor device related to the disclosure, by including the N+ layer, the concentration of carriers remaining at the time of turn-off can be made relatively low, and the loss at the time of turn-off can be reduced. In addition, the breakdown voltage can be improved by an electric field generated by the anode trench.

PREFERRED EMBODIMENT OF THE PRESENT INVENTION

Hereinafter, embodiments of the disclosure are described with reference to the drawings. Note that, the following embodiments do not limit the scope of the disclosure, and configurations obtained by selectively combining multiple examples are also included in the disclosure.

Configuration of Semiconductor Device

Figure 1A:
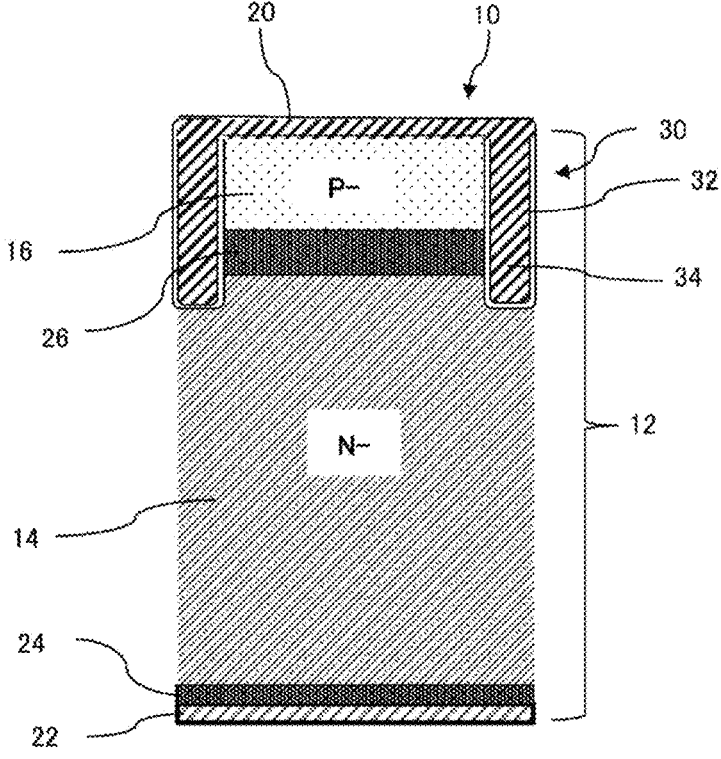
FIG. 1A is a schematic diagram showing a cross-sectional configuration of a semiconductor device (diode) according to an embodiment.
Figure 1B:
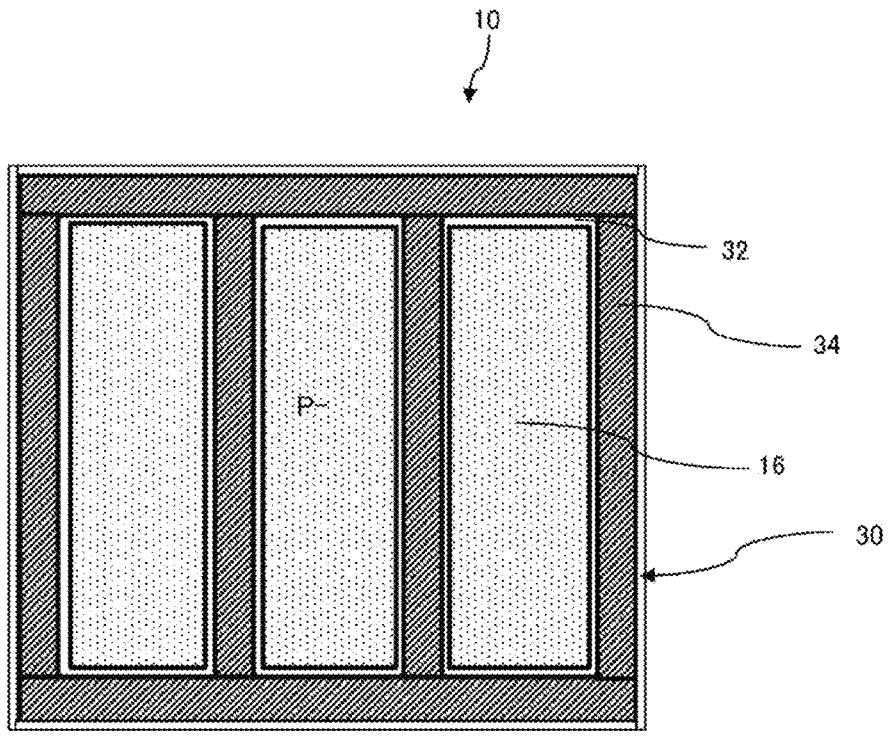
FIG. 1B is a schematic diagram showing a planar configuration of the semiconductor device (diode) according to the embodiment.

FIG. 1A is a schematic diagram showing a cross-sectional configuration of a semiconductor device according to an embodiment. And, FIG. 1B is a plan view of the semiconductor device according to the embodiment. Note that, FIG. 1B is shown with an anode electrode 20 on an upper surface omitted. In this example, a semiconductor device 10 is a diode.

The semiconductor device 10 includes a semiconductor substrate 12. The semiconductor substrate 12 is configured by, for example, a silicon (Si) wafer, but can also be configured by another semiconductor such as SiC or gallium oxide. In addition, in the embodiment, an N-type FZ wafer is used, which is formed by using a FZ (floating zone) method and in which an N-type impurity is doped.

Because the N-type is used as the semiconductor substrate 12, a large part of the semiconductor substrate 12 directly functions as an N layer 14. The N layer 14 is generally referred to as N-drift layer.

By doping a P-type impurity from a surface on one side (hereinafter, referred to as the front surface), a P layer 16 including carriers (holes) is formed on the front surface side of the N layer 14. The P layer 16 constitutes an anode region. Here, in the embodiment, by doping the N-type impurity, an N+ layer 26 including carriers (electrons) is formed on the front surface side of the N layer 14, and then the P layer 16 is formed. Therefore, the N+ layer 26 is formed between the N layer 14 and the P layer 16. The N+ layer 26 has a higher carrier concentration than the N layer 14.

The anode electrode 20 is formed on the front surface of the semiconductor substrate 12, that is, on the P layer 16. The anode electrode 20 may be formed by a metal such as aluminum.

A cathode electrode 22 having a higher impurity concentration than the N layer 14 is formed on a surface of the semiconductor substrate 12 on the other side (hereinafter, referred to as the back surface), that is, on the back surface side of the N layer 14, via a back surface N+ layer 24. The cathode electrode 22 can also be formed by a metal similarly to the anode electrode 20. By the back surface N+ layer 24, electrons are smoothly injected from the cathode electrode 22.

Furthermore, an anode trench 30 extending from the front surface of the semiconductor substrate 12 toward the back surface side is arranged. In addition, as shown in FIG. 1B, the anode trench 30 surrounds the periphery of the P layer 16 constituting the anode region. In this example, the P layer 16 is divided into three parts, and is arranged on both sides of the semiconductor substrate 12. The anode trench 30 is preferably uniformly arranged in a plan view so that a relatively uniform electric field can be applied to the peripheral N+ layer 26.

The anode trench 30 has a groove-like hole extending from the front surface toward the back surface direction of the semiconductor substrate 12, an insulating film 32 is formed on a peripheral surface of the hole, and a conductive material 34 is embedded inside the hole. The conductive material 34 is directly connected to the anode electrode 20 at the top part. The conductive material 34 can be formed by a metal such as aluminum similarly to the anode electrode 20, or can be formed by polysilicon or the like. In addition, the insulating film 32 can be formed by forming a hole in the semiconductor substrate 12 by anisotropic etching or the like and then oxidizing peripheral silicon, or may be formed by other methods. In addition, the insulating film 32 may be formed on the whole part except for a top surface (a surface in contact with the anode electrode 20). That is, the insulating film 32 is arranged among the P layer 16, the N+ layer 26, and the N layer 14.

This semiconductor device 10 functions as a diode. A forward current flows by applying a positive forward voltage between the anode electrode 20 and the cathode electrode 22. When a reverse voltage is applied between the anode electrode 20 and the cathode electrode 22, no current flows if the applied voltage is less than or equal to the breakdown voltage.

When the forward voltage is applied, holes are supplied from the anode electrode 20 and electrons are supplied from the cathode electrode 22. The holes supplied from the anode electrode 20 recombine with the electrons in the N+ layer 26, and enter the N layer 14 after some of the holes are eliminated. In addition, the electrons flow into the N layer 14 from the cathode electrode 22, which causes conductivity modulation, thereby resulting in a low VF. That is, the holes moving from the P layer 16 to the N layer 14 are reduced by the N+ layer 26. In addition, the quantity of the holes entering the N layer 14 can be adjusted by the carrier concentration of the N+ layer 26, and the quantity of the carriers remaining in the P layer 16 and the N layer 14 at the time of turn-off can be set to an appropriate value. Therefore, the VF at the time of turn-on can be maintained at an appropriate value, and the switching loss at the time of turn-off can be suppressed.

Moreover, the semiconductor device 10 according to the embodiment can be directly used as a diode, and can also be used in various elements in which a diode is incorporated.

Recovery Waveform

Figure 2:
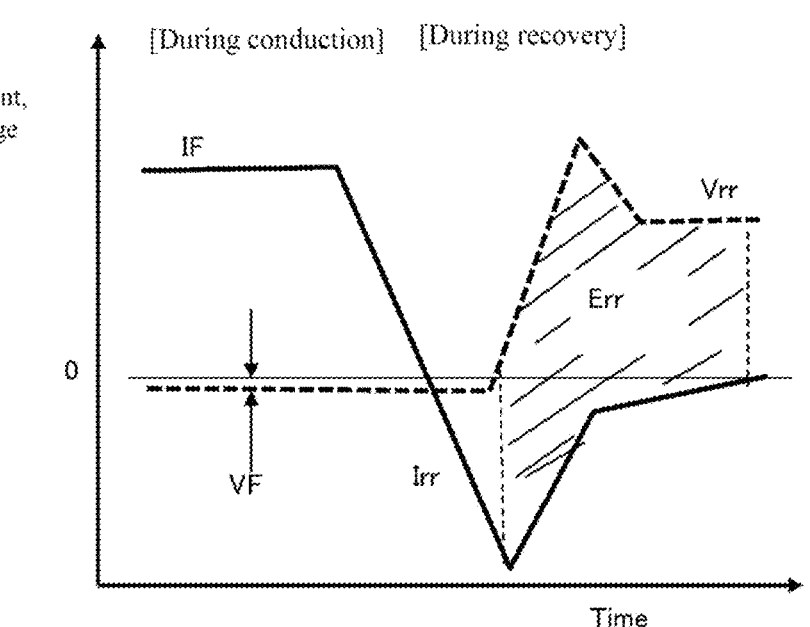
FIG. 2 shows voltage and current waveforms of a general diode during recovery.

FIG. 2 is a diagram showing voltage and current waveforms of a general diode during recovery which switches from ON to OFF. First, during conduction, the voltage between the anode electrode 20 and the cathode electrode 22 is the forward voltage drop VF, the voltage becomes a predetermined small voltage in a state that there are sufficient P-type and N-type carriers, and a predetermined forward current IF flows. In this example, voltage Vrr is a cathode voltage.

Here, the current IF linearly decreases by applying a reverse voltage. This is implemented by withdrawing the holes from the N layer 14 to the anode electrode 20 via the P layer 16 and withdrawing the electrons to the cathode electrode 22. In this case, the current Irr significantly fluctuates to a negative value temporarily and then becomes close to 0, and the cathode voltage Vrr significantly fluctuates to a positive value and then becomes stable at the applied voltage.

The energy loss during recovery is Vrr*Irr*time, and the loss during a period from when Vrr becomes positive to when Irr becomes 0 is recovery loss Err.

Moreover, in the embodiment, because the concentration of the carriers remaining at the time of turn-off is low, the time until the current Irr becomes 0 is short, and thus the loss Err becomes small.

Figure 3:
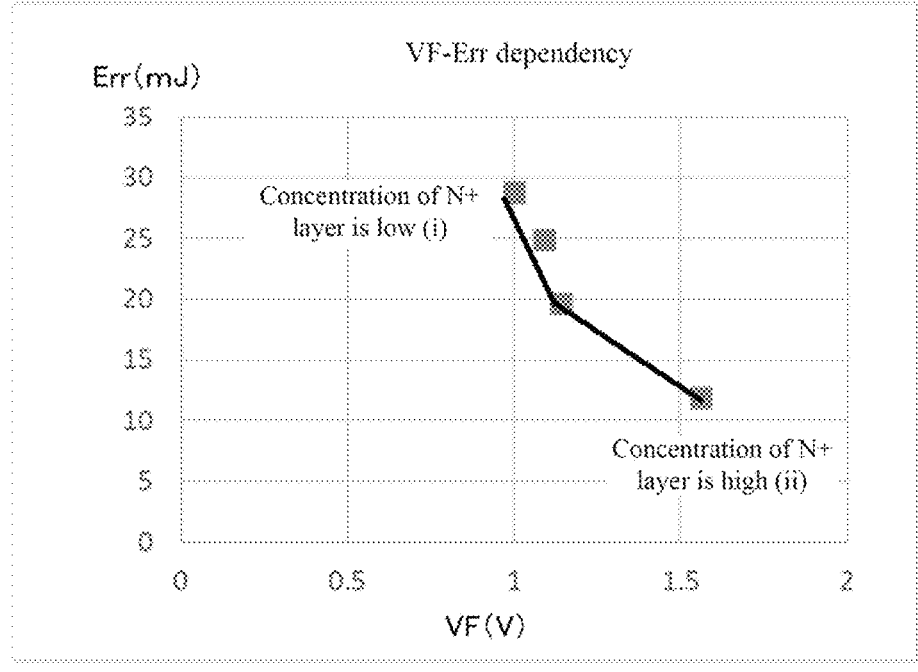
FIG. 3 is a diagram showing a relationship between a recovery loss Err and a forward voltage drop VF of a diode according to the embodiment.

FIG. 3 is a diagram showing a relationship between the carrier concentration of the N+ layer 26 and the VF, and a relationship between the carrier concentration of the N+ layer 26 and the Err in the semiconductor device according to the embodiment. As shown in the figure, when the carrier concentration of the N+ layer 26 is low, the loss Err increases, and when the carrier concentration of the N+ layer 26 is high, the VF increases. In the embodiment, the VF and the Err are set to appropriate values by appropriately setting the carrier concentration of the N+ layer 26.

As can be seen according to various studies, in the semiconductor device 10, desired characteristics can be obtained by setting the peak carrier concentration of the N+ layer 26 to about $1e^{17}$ to $3e^{17}/cm^3$.

Moreover, when the forward voltage is applied for a long period of time under operating conditions, the carrier concentration of the N+ layer 26 may be lowered, and when turn-on and turn-off are repeated, the carrier concentration may be increased.

About Breakdown Voltage

Here, if the N+ layer 26 is arranged, the breakdown voltage of the diode decreases. This is because the N+ layer 26 facilitates the movement of carriers in an opposite direction.

In the embodiment, the anode trench 30 is included. In particular, the anode trench 30 extends to the N layer 14 through the N+ layer 26. The inside of the anode trench 30 becomes the voltage of the anode electrode 20, and thus when a reverse voltage is applied, the electrons in the N+ layer 26 are pulled away from the anode trench 30 toward the N layer 14, and a depletion layer spreads from the inside of the N+ layer 26 to the N layer 14. In this way, the breakdown voltage of the semiconductor device 10 can be improved.

Figure 4:
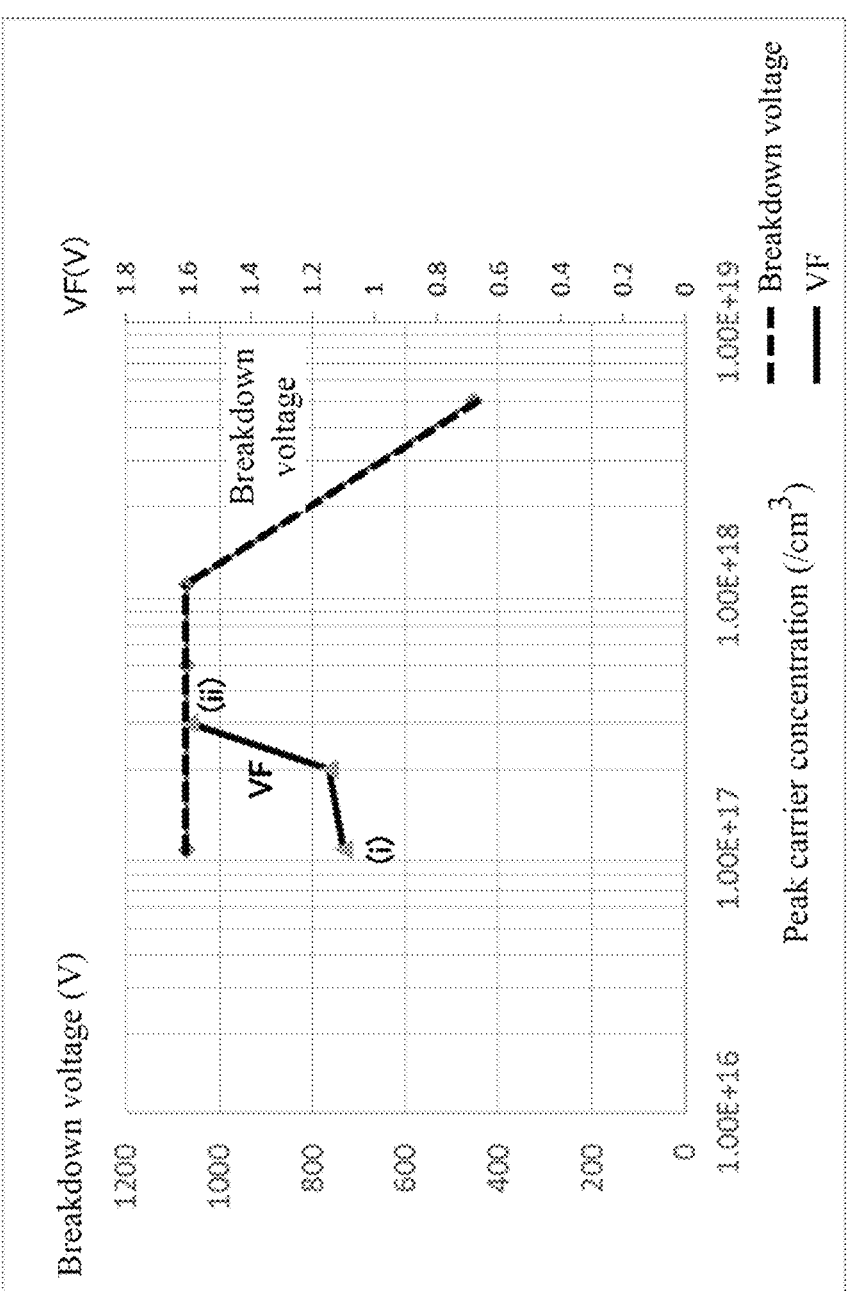
FIG. 4 is a diagram showing a relationship between the peak carrier concentration in an N+ layer and the VF, and a relationship between the peak carrier concentration in an N+ layer and the breakdown voltage.

FIG. 4 is a diagram showing a relationship between the carrier concentration and the breakdown voltage, and the relationship between carrier concentration and the VF in the semiconductor device 10 according to the embodiment. As shown in the figure, in the embodiment, a sufficiently high breakdown voltage can be maintained even if the N+ layer 26 is arranged.

Moreover, when the width of a mesa region between two anode trenches 30 is set to 1 μm, the depth of the anode trench 30 is set to 5 μm, and a lower end of the anode trench 30 is extended to the N layer 14, the breakdown voltage as shown in FIG. 4 is obtained.

If the depth of the anode trench 30 is not sufficient, the depletion layer of the N+ layer 26 is also insufficient, and the breakdown voltage decreases. Therefore, when it is desired to increase the breakdown voltage, the anode trench 30 preferably penetrates the N+ layer 26 and reaches the N layer 14. Moreover, the anode trench 30 may be terminated within the N+ layer 26 when the breakdown voltage need not be increased so largely.

In this way, in the embodiment, by arranging the N+ layer 26 and adjusting the carrier concentration therein, an appropriate setting can be made for the trade-off between the VF and the Err. In addition, by arranging the anode trench, the breakdown voltage can be sufficient.

Manufacturing Process

Figure 5:
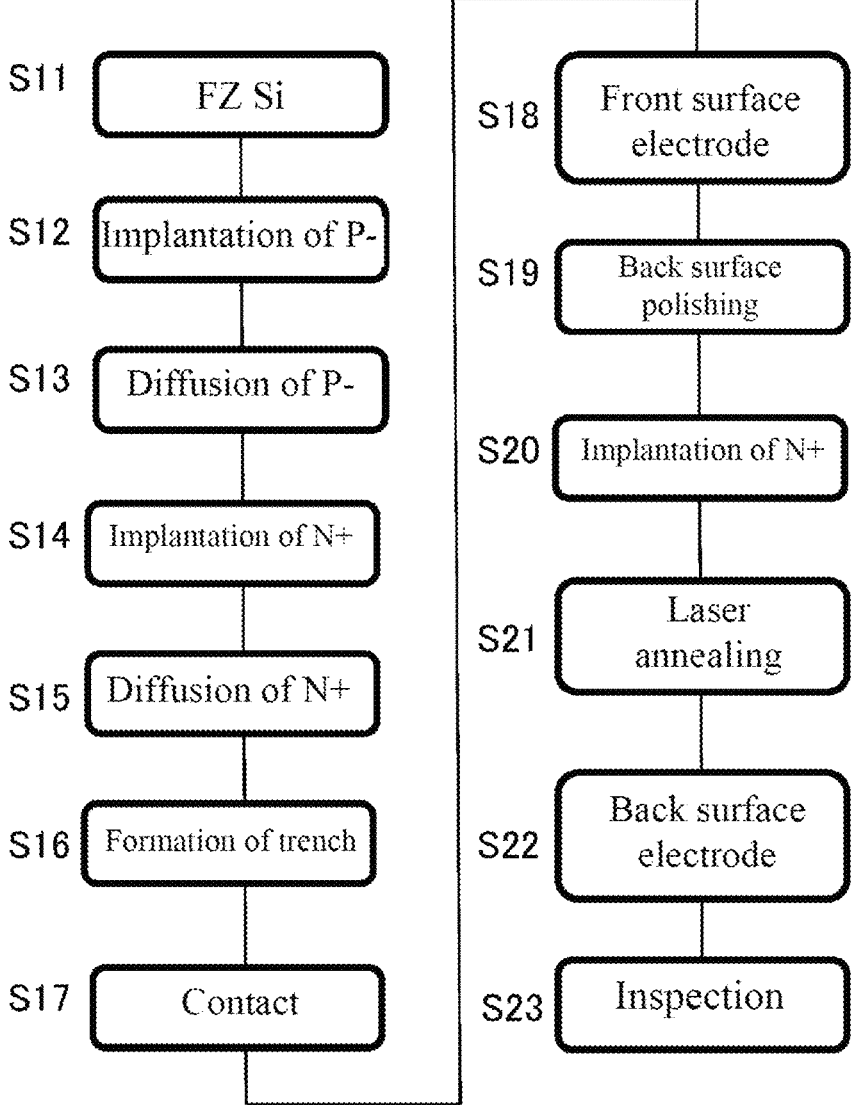
FIG. 5 is a diagram showing a manufacturing process of the semiconductor device according to the embodiment.

FIG. 5 is a diagram showing a manufacturing process of the semiconductor device 10 according to the embodiment. First, the semiconductor substrate 12 is prepared (S11). As the semiconductor substrate 12, for example, a substrate used is a floating zone (FZ) silicon wafer and is also an N-type wafer.

A P-type impurity from the front surface side is doped (implanted) (S12) and diffused (S13) to form the P layer 16 of P−. An N-type impurity from the front surface side is doped (implanted) (S14) and diffused (S15) to form the N+ layer 26 of N+.

Then, the anode trench 30 is formed (S16). Subsequently, a contact is formed (S17), and a front surface electrode, that is, the anode electrode 20, is formed on the front surface (S18).

After that, the back surface side is polished (S19), and then an N-type impurity is doped (S20) to form the back surface N+ layer 24. After the impurity is diffused by laser annealing (S21), a back surface electrode, that is, the cathode electrode 22 is formed (S22).

In this way, the semiconductor device 10 is formed, various inspections are then performed on the semiconductor device 10 (S23), and thus the manufacturing process ends.

Description of the Reference Numerals

10: semiconductor device
12: semiconductor substrate
14: N layer
16: P layer
20: anode electrode
22: cathode electrode
24: back surface N+ layer
26: N+ layer
30: anode trench
32: insulating film
34: conductive material

What is claimed is:

1. A semiconductor device, comprising:
a semiconductor substrate;
an anode electrode, formed on a surface of the semiconductor substrate on one side;
a cathode electrode, formed on a surface of the semiconductor substrate on the other side;
a P layer, formed on the anode electrode side in the semiconductor substrate;
an N layer, formed on the cathode electrode side of the P layer in the semiconductor substrate;
an N+ layer, arranged between the P layer and the N layer and having a higher carrier concentration than the N layer; and
an anode trench, which extends from the surface of the semiconductor substrate on one side toward the surface on the other side and extends to the N+ layer through the P layer, wherein an insulating film is formed in the anode trench to cover an inner wall of the anode trench, and a conductive material arranged inside the anode trench so that insulating film is formed between the N+ layer and the conductive material, wherein the anode trench surrounds a periphery of the P layer in a plane view.

2. The semiconductor device according to claim 1, wherein
the anode trench extends to the N layer through the N+ layer, and an insulating film is formed between the anode trench and the N layer.

3. The semiconductor device according to claim 1, wherein
the semiconductor substrate is configured by silicon wafer.

* * * * *